(12) United States Patent
Krassowski et al.

(10) Patent No.: US 6,758,263 B2
(45) Date of Patent: Jul. 6, 2004

(54) HEAT DISSIPATING COMPONENT USING HIGH CONDUCTING INSERTS

(75) Inventors: Daniel W. Krassowski, Columbia Township, OH (US); Gary G. Chen, Parma, OH (US)

(73) Assignee: Advanced Energy Technology Inc., Wilmington, DE (US)

( * ) Notice: Subject to any disclaimer, the term of this patent is extended or adjusted under 35 U.S.C. 154(b) by 0 days.

(21) Appl. No.: 10/015,459

(22) Filed: Dec. 13, 2001

(65) Prior Publication Data

US 2003/0116312 A1 Jun. 26, 2003

(51) Int. Cl.$^7$ ................................................ F28F 7/00
(52) U.S. Cl. ...................... 165/185; 165/80.3; 165/905; 361/704; 361/697; 257/720
(58) Field of Search ................ 165/185, 80.3, 165/905; 361/704, 707, 708; 257/720

(56) References Cited

U.S. PATENT DOCUMENTS

| | | | |
|---|---|---|---|
| 3,678,995 A | * 7/1972 | Collard | 165/185 |
| 4,234,638 A | * 11/1980 | Yamazoe et al. | 428/133 |
| 4,782,893 A | * 11/1988 | Thomas | 165/185 |
| 4,812,792 A | 3/1989 | Leibowitz | |
| 4,878,152 A | 10/1989 | Sauzade et al. | 361/386 |
| 5,255,738 A | * 10/1993 | Przilas | 165/185 |
| 5,287,248 A | * 2/1994 | Montesano | 361/708 |
| 5,316,080 A | 5/1994 | Banks et al. | 165/185 |
| 5,366,688 A | 11/1994 | Terpstra et al. | 419/36 |
| 5,542,471 A | 8/1996 | Dickinson | 165/170 |
| 5,660,917 A | * 8/1997 | Fujimori et al. | 428/195 |
| 5,944,097 A | * 8/1999 | Gungor et al. | 165/185 |
| 5,958,572 A | * 9/1999 | Schmidt et al. | 428/320.3 |
| 6,027,807 A | 2/2000 | Inoue et al. | 428/408 |
| 6,060,166 A | * 5/2000 | Hoover et al. | 428/408 |
| 6,075,701 A | 6/2000 | Ali et al. | 361/704 |
| 6,131,651 A | 10/2000 | Richey, III | 165/185 |
| 6,141,216 A | 10/2000 | Holung et al. | |
| 6,208,513 B1 | 3/2001 | Fitch et al. | 361/704 |
| 6,503,626 B1 | * 1/2003 | Norley et al. | 428/408 |
| 6,555,223 B2 | * 4/2003 | Kubo | 428/408 |
| 2002/0157819 A1 | * 10/2002 | Norley et al. | 165/185 |

OTHER PUBLICATIONS

European Patent Application EP 0 673 900 A2, Publication Date Sep. 27, 1995, "Carbon/carbon composites and electrical apparatus containing the same." The B.F. Goodrich Company (Inventor Wei–Teh Shih).
Exhibit A—Radian Heatsinks website—part No. HS7118CF12VCB.
Exhibit B—Arkua Technology Co. website—Arkua Cooler.
U.S. patent appl. Ser. No. 09/847,722 (Not Prior Art).
U.S. patent appl. Ser. No. 09/847,717 (Not Prior Art).

* cited by examiner

Primary Examiner—Terrell McKinnon
(74) Attorney, Agent, or Firm—Waddey & Patterson; James R. Cartiglia

(57) ABSTRACT

A thermal management system provides a heat dissipating component using a high thermal conductivity insert. The heat dissipating component may be a spreader or heat sink, and includes a planar graphite member having high thermal conductivity along the plane of the member and having a relatively low thermal conductivity through the thickness of the member. A cavity is formed through the thickness of the member and the high conductivity insert is received in the cavity. The insert may be an isotropic high thermal conductivity material such as copper or an anisotropic material such as graphite oriented to have high conductivity in the direction of the thickness of the planar element.

23 Claims, 6 Drawing Sheets

HEAT DISSIPATING COMPONENT USING HIGH CONDUCTING INSERTS

TECHNICAL FIELD

The present invention relates to a heat dissipating component capable of managing the heat from a heat source such as an electronic device. More particularly, the present invention relates to a heat dissipating component effective for dissipating the heat generated by an electronic device, wherein the heat dissipating component is constructed by assembling together an anisotropic graphite planar element with a high thermal conductivity core element.

BACKGROUND OF THE INVENTION

With the development of more and more sophisticated electronic devices, including those capable of increasing processing speeds and higher frequencies, having smaller size and more complicated power requirements, and exhibiting other technological advances, such as microprocessors and integrated circuits in electronic and electrical components and systems as well as in other devices such as high power optical devices, relatively extreme temperatures can be generated. However, microprocessors, integrated circuits and other sophisticated electronic components typically operate efficiently only under a certain range of threshold temperatures. The excessive heat generated during operation of these components can not only harm their own performance, but can also degrade the performance and reliability of the overall system and can even cause system failure. The increasingly wide range of environmental conditions, including temperature extremes, in which electronic systems are expected to operate, exacerbates the negative effects of excessive heat.

With the increased need for heat dissipation from microelectronic devices, thermal management becomes an increasingly important element of the design of electronic products. Both performance reliability and life expectancy of electronic equipment are inversely related to the component temperature of the equipment. For instance, a reduction in the operating temperature of a device such as a typical silicon semiconductor can correspond to an exponential increase in the reliability and life expectancy of the device. Therefore, to maximize the life-span and reliability of a component, controlling the device operating temperature within the limits set by the designers is of paramount importance.

Several types of heat dissipating components are utilized to facilitate heat dissipation from electronic devices. The present invention is directly applicable to several of these heat dissipating components, including those generally referred to as heat spreaders, those generally referred to as cold plates, and those generally referred to as heat sinks, among others.

These heat dissipating components facilitate heat dissipation from the surface of a heat source, such as a heat-generating electronic device, to a cooler environment, usually air. In many typical situations, heat transfer between the solid surface of the electronic device and the air is the least efficient within the system, and the solid-air interface thus represents the greatest barrier for heat dissipation. The heat dissipating components seek to increase the heat transfer efficiency between the electronic device and the ambient air primarily by increasing the surface area that is in direct contact with the air or other heat transfer media. This allows more heat to be dissipated and thus lowers the electronic device operating temperature. The primary purpose of a heat dissipating component is to help maintain the device temperature below the maximum allowable temperature specified by its designer/manufacturer.

Typically, the heat dissipating components are formed of a metal, especially copper or aluminum, due to the ability of metals like copper to readily absorb heat and transfer it about its entire structure. In the case of heat sinks, copper heat sinks are often formed with fins or other structures to increase the surface area of the heat sink, with air being forced across or through the fins (such as by a fan) to effect heat dissipation from the electronic component, through the copper heat sink and then to the air.

Limitations exist, however, with the use of metallic heat dissipating components. One limitation relates to the relative isotropy of a metal that is, the tendency of a metallic structure to distribute heat relatively evenly about the structure. The isotropy of a metal means that heat transmitted to a metallic heat dissipating component becomes distributed about the structure rather than being preferentially directed to a desired location.

In addition, the use of copper or aluminum heat dissipating elements can present a problem because of the weight of the metal, particularly when the heat transmitting area of the heat dissipating component is significantly larger than that of the electronic device. For instance, pure copper weighs 8.96 grams per cubic centimeter ($g/cm^3$) and pure aluminum weighs 2.70 $g/cm^3$ (compare with graphite articles, which typically weigh less than about 1.8 $g/cm^3$).

For example, in many applications, several heat sinks need to be arrayed on, e.g., a circuit board to dissipate heat from a variety of components on the board. If metallic heat sinks are employed, the sheer weight of the metal on the board can increase the chances of the board cracking or of other equally undesirable effects, and increases the weight of the component itself.

In the case of larger heat dissipating components such as for example that class of components known as heat spreaders, the weight of a pure copper heat spreader requires special mechanical features and designs to hold the heat spreader.

What is desired, therefore, is a heat dissipating component effective for dissipating heat from a heat source such as an electronic device. The heat dissipating component should advantageously be relatively anisotropic, as compared to a metal like copper or aluminum and exhibit a relatively high ratio of thermal conductivity to weight. One group of materials suitable for use in heat sinks are those materials generally known as graphites, but in particular anisotropic graphites such as those based on natural graphites and flexible graphite as described below.

Graphites are made up of layer planes of hexagonal arrays or networks of carbon atoms. These layer planes of hexagonally arranged carbon atoms are substantially flat and are oriented or ordered so as to be substantially parallel and equidistant to one another. The substantially flat, parallel equidistant sheets or layers of carbon atoms, usually referred to as graphene layers or basal planes, are linked or bonded together and groups thereof are arranged in crystallites. Highly ordered graphites consist of crystallites of considerable size: the crystallites being highly aligned or oriented with respect to each other and having well ordered carbon layers. In other words, highly ordered graphites have a high degree of preferred crystallite orientation. It should be noted that graphites possess anisotropic structures and thus exhibit or possess many properties that are highly directional e.g. thermal and electrical conductivity and fluid diffusion.

Briefly, graphites may be characterized as laminated structures of carbon, that is, structures consisting of superposed layers or laminae of carbon atoms joined together by weak van der Waals forces. In considering the graphite structure, two axes or directions are usually noted, to wit, the "c" axis or direction and the "a" axes or directions. For simplicity, the "c" axis or direction may be considered as the direction perpendicular to the carbon layers. The "a" axes or directions may be considered as the directions parallel to the carbon layers or the directions perpendicular to the "c" direction. The graphites suitable for manufacturing flexible graphite sheets possess a very high degree of orientation.

As noted above, the bonding forces holding the parallel layers of carbon atoms together are only weak van der Waals forces. Natural graphites can be treated so that the spacing between the superposed carbon layers or laminae can be appreciably opened up so as to provide a marked expansion in the direction perpendicular to the layers, that is, in the "c" direction, and thus form an expanded or intumesced graphite structure in which the laminar character of the carbon layers is substantially retained.

Graphite flake which has been greatly expanded and more particularly expanded so as to have a final thickness or "c" direction dimension which is as much as about 80 or more times the original "c" direction dimension can be formed without the use of a binder into cohesive or integrated sheets of expanded graphite, e.g. webs, papers, strips, tapes, foils, mats or the like (typically referred to as "flexible graphite"). The formation of graphite particles which have been expanded to have a final thickness or "c" dimension which is as much as about 80 times or more the original "c" direction dimension into integrated flexible sheets by compression, without the use of any binding material, is believed to be possible due to the mechanical interlocking, or cohesion, which is achieved between the voluminously expanded graphite particles.

In addition to flexibility, the sheet material, as noted above, has also been found to possess a high degree of anisotropy with respect to thermal and electrical conductivity and fluid diffusion, comparable to the natural graphite starting material due to orientation of the expanded graphite particles and graphite layers substantially parallel to the opposed faces of the sheet resulting from very high compression, e.g. roll pressing. Sheet material thus produced has excellent flexibility, good strength and a very high degree of orientation.

Briefly, the process of producing flexible, binderless anisotropic graphite sheet material, e.g. web, paper, strip, tape, foil, mat, or the like, comprises compressing or compacting under a predetermined load and in the absence of a binder, expanded graphite particles which have a "c" direction dimension which is as much as about 80 or more times that of the original particles so as to form a substantially flat, flexible, integrated graphite sheet. The expanded graphite particles that generally are worm-like or vermiform in appearance, once compressed, will maintain the compression set and alignment with the opposed major surfaces of the sheet. The density and thickness of the sheet material can be varied by controlling the degree of compression. The density of the sheet material can be within the range of from about 0.04 $g/cm^3$ to about 2.0 $g/cm^3$. The flexible graphite sheet material exhibits an appreciable degree of anisotropy due to the alignment of graphite particles parallel to the major opposed, parallel surfaces of the sheet, with the degree of anisotropy increasing upon roll pressing of the sheet material to increase orientation. In roll pressed anisotropic sheet material, the thickness, i.e. the direction perpendicular to the opposed, parallel sheet surfaces comprises the "c" direction and the directions ranging along the length and width, i.e. along or parallel to the opposed, major surfaces comprises the "a" directions and the thermal, electrical and fluid diffusion properties of the sheet are very different, by orders of magnitude, for the "c" and "a" directions.

SUMMARY OF THE INVENTION

The present invention provides a thermal management system which includes an anisotropic planar element having a relatively high thermal conductivity in the plane of the planar element and having a relatively low thermal conductivity across a thickness of the planar element in a direction normal to the plane of the planar element. The planar element has a cavity therein, and a core or insert is closely received in the cavity. The core in this embodiment is constructed of an isotropic core material so that heat from a heat source can be conducted via the core into the thickness of the planar element and then out across the plane of the planar element In another embodiment the present invention provides a thermal management system which includes a heat source having a heat transmitting surface, an anisotropic graphic planar element, and an insert. The planar element has x and y dimensions defining a generally planar extent of the planar element and has a z dimension defining a thickness of the planar element. The planar element has a relatively high thermal conductivity in the x and y directions and a relatively low thermal conductivity in the z direction. Thus the x and y directions as used in this disclosure correspond to what are conventionally referred to as the "a" axes for anisotropic graphite, and the z direction as used herein corresponds to the "c" direction or axis of anisotropic graphite. The planar element has a cavity defined therein extending at least partially through the thickness of the planar element. The insert is received in the cavity in heat conducting engagement with the planar element. The insert has a heat receiving surface engaging the heat conducting surface of the heat source, so that heat from the heat source flows across the heat transmitting surface and the heat receiving surface into the insert in the z direction and then out through the planar element in the x and y directions.

In another embodiment of the invention a method is provided for dissipating heat from the heat source. The method includes steps of:

(a) providing an anisotropic heat dissipating element capable of relatively high conductivity in the x and y directions, and having relatively low thermal conductivity in a z direction perpendicular to the x and y directions, the heat dissipating element having a cavity defined therethrough in the z direction and having an isotropic heat conducting insert disposed in the cavity;

(b) placing the insert in heat conducting engagement with a heat source;

(c) conducting heat from the heat source through the insert and into the anisotropic heat dissipating element; and (d) conducting heat through the heat dissipating element in the x and y directions.

Accordingly, it is an object of the present invention to provide improved designs for heat dissipating components including anisotropic graphite planar members.

Another object of the present invention is the provision of a heat dissipating component including a high thermal conductivity core for conducting heat from a heat source to an anisotropic graphite heat dissipating element.

And another object of the present invention is the provision of heat dissipating components of relatively light weight such as provided by graphite, but having a high thermal conductivity at the interface of the heat dissipating component with the heat source.

And another object of the present invention is the provision of composite heat dissipating components utilizing anisotropic graphite material to conduct heat across the major surface areas of the component, while using isotropic high thermal conductivity materials such as copper for conducting heat from the heat source into the body of the anisotropic materials.

And another object of the present invention is the provision of economical constructions for heat dissipating components.

Other and further objects, features, and advantages of the present invention will be readily apparent to those skilled in the art, upon a reading of the following disclosure when taken in conjunction with the accompanying drawings.

DETAILED DESCRIPTION OF THE PREFERRED EMBODIMENTS

Figure 1:
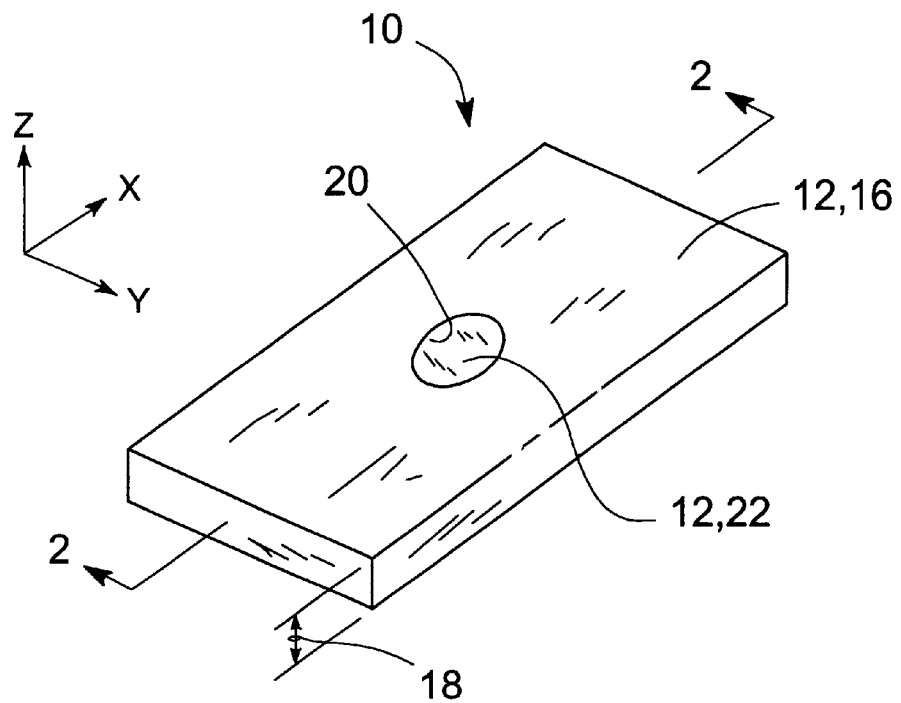
FIG. 1 is a perspective schematic view of the heat dissipating component in the form of a heat spreader having a graphite planar element and a single cylindrical insert therein.

As noted, the present invention is directed to heat dissipating components constructed from a graphite planar element having a core or insert of high thermal conductivity placed in a cavity in the graphite element.

Before describing the construction of the heat dissipating components, a brief description of graphite and its formation into flexible sheets, which will become the primary substrate for forming the products of the present invention, is in order.
Preparation of Flexible Graphite Sheet Graphite is a crystalline form of carbon comprising atoms covalently bonded in flat layered planes with weaker bonds between the planes. By treating particles of graphite, such as natural graphite flake, with an intercalant of, e.g. a solution of sulfuric and nitric acid, the crystal structure of the graphite reacts to form a compound of graphite and the intercalant. The treated particles of graphite are hereafter referred to as "particles of intercalated graphite." Upon exposure to high temperature, the intercalant within the graphite decomposes and volatilizes, causing the particles of intercalated graphite to expand in dimension as much as about 80 or more times its original volume in an accordion-like fashion in the "c" direction, i.e. in the direction perpendicular to the crystalline planes of the graphite. The exfoliated graphite particles are vermiform in appearance, and are therefore commonly referred to as worms. The worms may be compressed together into flexible sheets that, unlike the original graphite flakes, can be formed and cut into various shapes and provided with small transverse openings by deforming mechanical impact.

Graphite starting materials suitable for use in the present invention include highly graphitic carbonaceous materials capable of intercalating organic and inorganic acids as well as halogens and then expanding when exposed to heat. These highly graphitic carbonaceous materials most preferably have a degree of graphitization of about 1.0. As used in this disclosure, the term "degree of graphitization" refers to the value g according to the formula:

$$g = \frac{3.45 - d(002)}{0.095}$$

where d(002) is the spacing between the graphitic layers of the carbons in the crystal structure measured in Angstrom units. The spacing d between graphite layers is measured by standard X-ray diffraction techniques. The positions of diffraction peaks corresponding to the (002), (004) and (006) Miller Indices are measured, and standard least-squares techniques are employed to derive spacing which minimizes the total error for all of these peaks. Examples of highly graphitic carbonaceous materials include natural graphites from various sources, as well as other carbonaceous materials such as carbons prepared by chemical vapor deposition and the like. Natural graphite is most preferred.

The graphite starting materials used in the present invention may contain non-carbon components so long as the crystal structure of the starting materials maintains the required degree of graphitization and they are capable of exfoliation. Generally, any carbon-containing material, the crystal structure of which possesses the required degree of graphitization and which can be exfoliated, is suitable for use with the present invention. Such graphite preferably has an ash content of less than twenty weight percent. More preferably, the graphite employed for the present invention will have a purity of at least about 94%. In the most preferred embodiment, the graphite employed will have a purity of at least about 98%.

A common method for manufacturing graphite sheet is described by Shane et al. in U.S. Pat. No. 3,404,061, the disclosure of which is incorporated herein by reference. In the typical practice of the Shane et al. method, natural graphite flakes are intercalated by dispersing the flakes in a solution containing e.g., a mixture of nitric and sulfuric acid, advantageously at a level of about 20 to about 300 parts by weight of intercalant solution per 100 parts by weight of graphite flakes (pph). The intercalation solution contains oxidizing and other intercalating agents known in the art. Examples include those containing oxidizing agents and oxidizing mixtures, such as solutions containing nitric acid, potassium chlorate, chromic acid, potassium permanganate, potassium chromate, potassium dichromate, perchloric acid, and the like, or mixtures, such as for example, concentrated nitric acid and chlorate, chromic acid and phosphoric acid, sulfuric acid and nitric acid, or mixtures of a strong organic acid, e.g. trifluoroacetic acid, and a strong oxidizing agent soluble in the organic acid. Alternatively, an electric potential can be used to bring about oxidation of the graphite. Chemical species that can be introduced into the graphite crystal using electrolytic oxidation include sulfuric acid as well as other acids.

In a preferred embodiment, the intercalating agent is a solution of a mixture of sulfuric acid, or sulfuric acid and phosphoric acid, and an oxidizing agent, i.e. nitric acid, perchloric acid, chromic acid, potassium permanganate, hydrogen peroxide, iodic or periodic acids, or the like. Although less preferred, the intercalation solution may contain metal halides such as ferric chloride, and ferric chloride mixed with sulfuric acid, or a halide, such as bromine as a solution of bromine and sulfuric acid or bromine in an organic solvent.

The quantity of intercalation solution may range from about 20 to about 150 pph and more typically about 50 to about 120 pph. After the flakes are intercalated, any excess solution is drained from the flakes and the flakes are water-washed. Alternatively, the quantity of the intercalation solution may be limited to between about 10 and about 50 pph, which permits the washing step to be eliminated as taught and described in U.S. Pat. No. 4,895,713, the disclosure of which is also herein incorporated by reference.

The particles of graphite flake treated with intercalation solution can optionally be contacted, e.g. by blending, with a reducing organic agent selected from alcohols, sugars, aldehydes and esters which are reactive with the surface film of oxidizing intercalating solution at temperatures in the range of 25° C. and 125° C. Suitable specific organic agents include hexadecanol, octadecanol, 1-octanol, 2-octanol, decylalcohol, 1,10 decanediol, decylaldehyde, 1-propanol, 1,3 propanediol, ethyleneglycol, polypropylene glycol, dextrose, fructose, lactose, sucrose, potato starch, ethylene glycol monostearate, diethylene glycol dibenzoate, propylene glycol monostearate, glycerol monostearate, dimethyl oxylate, diethyl oxylate, methyl formate, ethyl formate, ascorbic acid and lignin-derived compounds, such as sodium lignosulfate. The amount of organic reducing agent is suitably from about 0.5 to 4% by weight of the particles of graphite flake.

The use of an expansion aid applied prior to, during or immediately after intercalation can also provide improvements. Among these improvements can be reduced exfoliation temperature and increased expanded volume (also referred to as "worm volume"). An expansion aid in this context will advantageously be an organic material sufficiently soluble in the intercalation solution to achieve an improvement in expansion. More narrowly, organic materials of this type that contain carbon, hydrogen and oxygen, preferably exclusively, may be employed. Carboxylic acids have been found especially effective. A suitable carboxylic acid useful as the expansion aid can be selected from aromatic, aliphatic or cycloaliphatic, straight chain or branched chain, saturated and unsaturated monocarboxylic acids, dicarboxylic acids and polycarboxylic acids which have at least 1 carbon atom, and preferably up to about 15 carbon atoms, which is soluble in the intercalation solution in amounts effective to provide a measurable improvement of one or more aspects of exfoliation. Suitable organic solvents can be employed to improve solubility of an organic expansion aid in the intercalation solution.

Representative examples of saturated aliphatic carboxylic acids are acids such as those of the formula $H(CH_2)_nCOOH$ wherein n is a number of from 0 to about 5, including formic, acetic, propionic, butyric, pentanoic, hexanoic, and the like. In place of the carboxylic acids, the anhydrides or reactive carboxylic acid derivatives such as alkyl esters can also be employed. Representative of alkyl esters are methyl formate and ethyl formate. Sulfuric acid, nitric acid and other known aqueous intercalants have the ability to decompose formic acid, ultimately to water and carbon dioxide. Because of this, formic acid and other sensitive expansion aids are advantageously contacted with the graphite flake prior to immersion of the flake in aqueous intercalant. Representative of dicarboxylic acids are aliphatic dicarboxylic acids having 2–12 carbon atoms, in particular oxalic acid, fumaric acid, malonic acid, maleic acid, succinic acid, glutaric acid, adipic acid, 1,5-pentanedicarboxylic acid, 1,6-hexanedicarboxylic acid, 1,10-decanedicarboxylic acid, cyclohexane-1,4-dicarboxylic acid and aromatic dicarboxylic acids such as phthalic acid or terephthalic acid. Representative of alkyl esters are dimethyl oxylate and diethyl oxylate. Representative of cycloaliphatic acids is cyclohexane carboxylic acid and of aromatic carboxylic acids are benzoic acid, naphthoic acid, anthranilic acid, p-aminobenzoic acid, salicylic acid, o-, m- and p-tolyl acids, methoxy and ethoxybenzoic acids, acetoacetamidobenzoic acids and, acetamidobenzoic acids, phenylacetic acid and naphthoic acids. Representative of hydroxy aromatic acids are hydroxybenzoic acid, 3-hydroxy-1-naphthoic acid, 3-hydroxy-2-naphthoic acid, 4-hydroxy-2-naphthoic acid, 5-hydroxy-1-naphthoic acid, 5-hydroxy-2-naphthoic acid, 6-hydroxy-2-naphthoic acid and 7-hydroxy-2-naphthoic acid. Prominent among the polycarboxylic acids is citric acid.

The intercalation solution will be aqueous and will preferably contain an amount of expansion aid of from about 1 to 10%, the amount being effective to enhance exfoliation. In the embodiment wherein the expansion aid is contacted with the graphite flake prior to or after immersing in the aqueous intercalation solution, the expansion aid can be admixed with the graphite by suitable means, such as a V-blender, typically in an amount of from about 0.2% to about 10% by weight of the graphite flake.

After intercalating the graphite flake, and following the blending of the intercalant coated intercalated graphite flake with the organic reducing agent, the blend is exposed to temperatures in the range of 25° to 125° C. to promote reaction of the reducing agent and intercalant coating. The heating period is up to about 20 hours, with shorter heating periods, e.g., at least about 10 minutes, for higher temperatures in the above-noted range. Times of one half hour or less, e.g., on the order of 10 to 25 minutes, can be employed at the higher temperatures.

The thus treated particles of graphite are sometimes referred to as "particles of intercalated graphite." Upon exposure to high temperature, e.g. temperatures of at least about 160° C. and especially about 700° C. to 1000° C. and higher, the particles of intercalated graphite expand as much as about 80 to 1000 or more times their original volume in an accordion-like fashion in the c-direction, i.e. in the direction perpendicular to the crystalline planes of the constituent graphite particles. The expanded, i.e. exfoliated, graphite particles are vermiform in appearance, and are therefore commonly referred to as worms. The worms may be compressed together into flexible sheets that, unlike the original graphite flakes, can be formed and cut into various shapes and provided with small transverse openings by deforming mechanical impact as hereinafter described.

Flexible graphite sheet and foil are coherent, with good handling strength, and are suitably compressed, e.g. by roll-pressing, to a thickness of about 0.075 mm to 3.75 mm and a typical density of about 0.1 to 1.5 grams per cubic centimeter ($g/cm^3$). From about 1.5–30% by weight of ceramic additives can be blended with the intercalated graphite flakes as described in U.S. Pat. No. 5,902,762 (which is incorporated herein by reference) to provide enhanced resin impregnation in the final flexible graphite product. The additives include ceramic fiber particles having a length of about 0.15 to 1.5 millimeters. The width of the particles is suitably from about 0.04 to 0.004 mm. The ceramic fiber particles are non-reactive and non-adhering to graphite and are stable at temperatures up to about 1100° C., preferably about 1400° C. or higher. Suitable ceramic fiber particles are formed of macerated quartz glass fibers, carbon and graphite fibers, zirconia, boron nitride, silicon carbide and magnesia fibers, naturally occurring mineral fibers such as calcium metasilicate fibers, calcium aluminum silicate fibers, aluminum oxide fibers and the like.

Preparation of Laminated Graphite Materials

The planar graphite elements of the heat dissipating components described below are preferably constructed from a laminated resin impregnated graphite material in the manner set forth in U.S. patent application Ser. No. 09/943,131, filed Aug. 31, 2001 of Norley et al. entitled "LAMINATES PREPARED FROM IMPREGNATED FLEXIBLE GRAPHITE SHEETS", assigned to the assignee of the present invention, the details of which are incorporated herein by reference.

According to the Norley et al. process, flexible graphite sheets prepared as described above and having a thickness of about 4 mm to 7 mm are impregnated with a thermosetting resin such as an epoxy, acrylic or phenolic resin system. Suitable epoxy resins include diglycidyl ether of bisphenol A (DGEBA) resin systems; other multifunctional epoxy resins systems are also suitable for use in the present invention. Suitable phenolic resin systems include those containing resole and novolak resins. The sheets are then calendered to a thickness of about 0.35 mm to 0.5 mm, at which time the calendered, epoxy impregnated flexible mats have a density of about 1.4 g/cm$^3$ to about 1.9 g/cm$^3$.

The amount of resin within the epoxy impregnated graphite sheets should be an amount sufficient to ensure that the final assembled and cured layered structure is dense and cohesive, yet the anisotropic thermal conductivity associated with a densified graphite structure has not been adversely impacted. Suitable resin content is preferably at least about 3% by weight, more preferably from about 5% to about 35% by weight depending on the characteristics desired in the final product.

In a typical resin impregnation step, the flexible graphite sheet is passed through a vessel and impregnated with the resin system from, e.g. spray nozzles, the resin system advantageously being "pulled through the mat" by means of a vacuum chamber. Typically, but not necessarily, the resin system is solvated to facilitate application into the flexible graphite sheet. The resin is thereafter preferably dried, reducing the tack of the resin and the resin-impregnated sheet.

One type of apparatus for continuously forming resin-impregnated and calendered flexible graphite sheet is shown in International Publication No. WO 00/64808, the disclosure of which is incorporated herein by reference.

Following the calendering step, the impregnated sheets are cut to suitable-sized pieces which are stacked together and placed in a press, where they are cured at an elevated temperature. The temperature should be sufficient to ensure that the lamellar structure is densified at the curing pressure, improving the anisotropy of the structure and hence its thermal properties as a heat dissipating device. Generally, this will require a temperature of from about 150° C. to 200° C. The pressure employed for curing will be somewhat a function of the temperature utilized, but will be sufficient to ensure that the lamellar structure is densified without adversely impacting the thermal properties of the structure. Generally, for convenience of manufacture, the minimum required pressure to densify the structure to the required degree will be utilized. Such a pressure will generally be from 1000 to 3000 pounds per square inch (psi). The curing time may vary depending on the resin system and the temperature and pressure employed, but generally will range from 0.5 hours to 2 hours. After curing is complete, the composites are seen to have a density of from about 1.8 g/cm$^3$ to 2.0 g/cm$^3$.

Advantageously, the resin present in the impregnated sheets can act as the adhesive for the composite material. Alternatively the calendered, impregnated, flexible graphite sheets are coated with an adhesive before the flexible sheets are stacked and cured. Suitable adhesives include epoxy-, acrlylic- and phenolic-based resins. Phenolic resins found especially useful in the practice of the present invention include phenolic-based resin systems including resole and novolak phenolics.

Optionally, non-graphite layers may be included in the pre-pressed stack. Such non-graphite layers may include metals, plastics or other non-metallics such as fiberglass or ceramics. The epoxy polymer in the impregnated graphite sheets is sufficient to, upon curing, adhesively bond the non-graphite as well as the impregnated graphite layers of the structure into place.

The following example is presented to further illustrate and explain the construction of suitable laminated structures and is not intended to be limiting in any regard. Unless otherwise indicated, all parts and percentages are by weight.

EXAMPLE 1

Graphite sheets with a weight per unit area of 70 mg/cm$^2$ with dimensions of approximately 30 cm by 30 cm were impregnated with epoxy such that the resulting calendered mats were 12 weight % epoxy. The epoxy employed was a diglycidyl ether of bisphenol A (DGEBA) elevated temperature cure formulation and the impregnation procedures involved saturation with an acetone-resin solution followed by drying at approximately 80° C. Following impregnation, the sheets were then calendered from a thickness of approximately 7 mm to a thickness of approximately 0.4 mm and a density of 1.63 g/cm$^3$. The calendered, impregnated sheets were then cut into disks with a diameter of approximately 50 mm and the disks were stacked 46 layers high. This stack of disks was then placed in a TMP (Technical Machine Products) press, and cured at 2600 psi at 150° C. for 1 hour. The resultant laminate had a density of 1.90 g/cm$^3$, a flexural strength of 8000 psi, a Young's modules of 7.5 Msi (millions of pounds per square inch) and an in plane resistivity of 6 microhm. The in-plane and through-thickness thermal conductivity values were 396 W/m·° C. and 6.9 W/m·° C., respectively. The laminates exhibited superior machinability, had a continuous pore free surface with a smooth finish and were suitable for use in electronic thermal management devices. The highly anisotropic thermal conductivity resulted in a structure highly adapted for use in piping heat away from sensitive electronics and into a heat sink. In addition, the density of the material, approximately 1.94 g/cm$^3$, is considerably below aluminum (2.7 g/cm$^3$) and much less than copper (8.96 g/cm$^3$). Thus, the specific thermal conductivity (that is, the ratio of thermal conductivity to density) of the graphite laminate is about three times that of aluminum and about four to six times that of copper.

The laminated graphite materials suitable for use with the present invention are not limited to those specific ones described above, and may for example include a laminate comprised of layers of pyrolytic graphite sheet such as that manufactured by Matsushita Electric Components Co., Ltd. Ceramic Division, 1006 Kadoma, Osaka, Japan under the trade name Panasonic "PGS"® Graphite Sheet.

Embodiments of FIGS. 1–9

Figure 2:
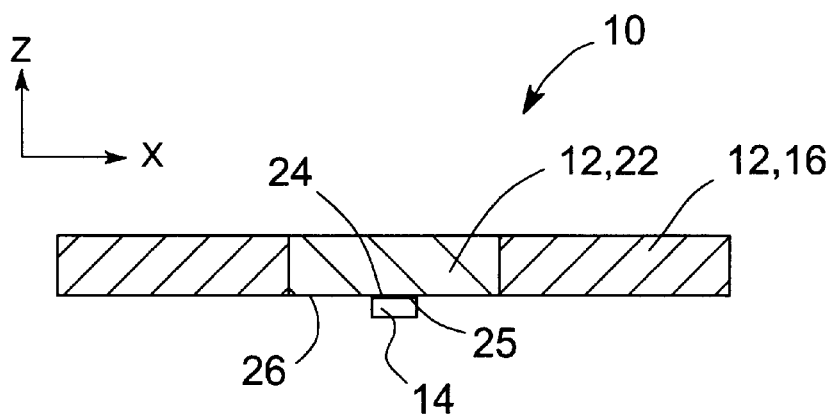
FIG. 2 is a cross sectional view taken along line 2—2 of FIG. 1 and showing the heat dissipating component assembled with a heat source such as an electronic device.

Referring now to the drawings, and particularly to FIGS. 1 and 2, a thermal management system is shown and generally designated by the numeral 10. The system 10 is in the form of a heat spreader 12 assembled with an electronic device 14, which may also be referred to as a heat source 14. The heat spreader 14 includes an anisotropic graphite planar element 16 having a relatively high thermal conductivity in the plane of the planar element 16 along dimensions x and y and having a relatively low thermal conductivity across a thickness 18 of the planar element in a direction z normal to the plane defined by dimensions x and y.

The planar element 16 has a cylindrical cavity 20 defined therein, and preferably defined entirely through the thickness 18. It will be understood, however, that it is possible for the cavity 20 to only extend partially into the thickness 18.

The heat spreader 12 includes a core or insert 22 received in the cavity 20.

The core 22 is preferably constructed of an isotropic core material, preferably a metal such as copper or aluminum In some embodiments, however, the core 22 could be constructed of an anisotropic material such as the graphite materials described herein, wherein the core is constructed so that the high thermal conductivity direction of the anisotropic material (commonly referred to as the "a" axes) is generally parallel to the z axis of the heat spreader shown in FIGS. 1 and 2.

The planar element 16 is preferably constructed from a laminated graphite material like that described above, wherein a plurality of resin impregnated graphite sheets are stacked and compressed together to form a rigid planar graphite element 16. Typical dimensions of the element 16 for a heat spreader device would have a length along the x axis on the order of 6 to 12 inches, a width along the y axis on the order of 6 to 12 inches, and a thickness 18 along the z axis on the order of ½ inch. Typical dimensions of the cylindrical cavity 20 would be a diameter of from 1 to 1½ inches.

As best seen in FIG. 2, the electronic device 14 has a top surface 24 which may also be referred to as a heat conducting surface or heat transmitting surface 24. The core 22 has a heat receiving surface 26 which is operatively engaged with the surface 24 of the electronic device 14 in the conventional manner, which may include the use of a thin thermal interface 25, or a layer of phase change material or thermal grease therebetween. The thermal interface 25 may be, for example, a thin layer of flexible graphite material.

Although the core 22 and cavity 20 are shown in FIGS. 1 and 2 as being cylindrical, they could be of any shape including circular, square, rectangular or other shape. The cylindrical shape may be preferred due to its ease of machining.

The heat receiving surface 26 of core 22 is preferably larger than the heat transmitting surface 24 of device 14 so that the heat receiving surface 26 is in operative contact with and covers the entire top surface 24 of electronic device 14. Otherwise, if a portion of the top surface 24 of electronic device 14 were covered by the graphite material 16, the graphite material would not transfer heat as effectively in the z direction and would cause the temperature of device 14 to rise.

Thus, as the electronic device 14 is operated and generates heat which must be dissipated therefrom, that heat flows across heat transmitting surface 24 and heat receiving surface 26 into the core 22 which rapidly conducts the heat in the direction z through the thickness 18 of planar graphite member 16. The heat is conducted across the interface between core 22 and cavity 20 into the planar graphite member 16 surrounding cavity 20 which then rapidly conducts the heat along the x-y plane of the planar graphite element 16 of heat spreader 12. That heat energy may then be dissipated further by known techniques such as transferring the same to a heat transfer fluid or the like.

Figure 3:
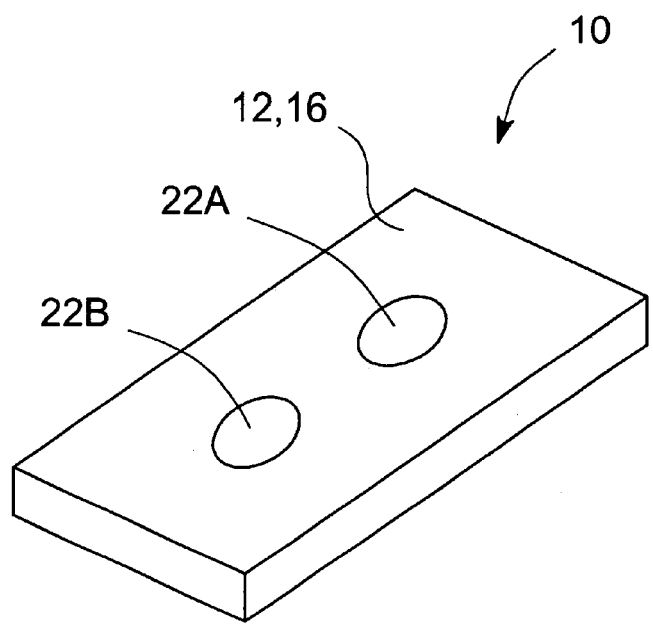
FIG. 3 is a perspective schematic view similar to that of FIG. 1 showing a heat spreader having multiple inserts

FIG. 3 shows an alternative embodiment of the apparatus 10 having a plurality of such inserts designated as 22A and 22B.

The following Table I compares the performance of the apparatus shown in FIGS. 1 and 2 for different material combinations. This data was generated by numerical modeling.

TABLE I

| # | Design Option | $T_{max}$ (° C.) | $R_{sa}$ (° C./W) | Thermal Conductivity and Graphite Orientation (W/m · ° C.) | | |
|---|---|---|---|---|---|---|
| | | | | X | Y | Z |
| 1 | Copper | 39.62 | 0.44 | | | |
| 2 | Graphite | 43.97 | 0.55 | | | |
| 3 | Graphite with Copper Insert | 39.77 | 0.44 | | | |
| 4 | Graphite with Graphite Insert | 40.07 | 0.45 | 7 | 400 | 400 |
| 5 | Graphite with Graphite Insert | 40.05 | 0.45 | 400 | 7 | 400 |

In design option #1 of Table I, an all copper heat spreader is shown for comparison. In design option #2 an all graphite heat spreader is shown for comparison where the highly conducting "a" axes of the graphite are aligned with the x and y axes of the heat spreader component. Option #2 is the graphite spreader without any insert. Design option #3 shows the present invention utilizing a graphite planar element with a copper insert. Design options #4 and #5 illustrate graphite planar elements with graphite inserts with the high conductivity direction of the graphite oriented in a direction perpendicular to the plane of the spreader. Both design options #4 and #5 perform nearly as well as the copper insert of design option #3 without the added weight of the copper insert.

In the data of Table I the units represent the following. $T_{max}$ is the hottest temperature on the electronic device for the conditions modeled; lower temperatures are indicative of better performance by the heat dissipating component. $R_{sa}$ represents the thermal resistance of the heat dissipating component, and again lower numbers are indicative of better performance by the heat dissipating component. The numbers for thermal conductivity for graphite materials represent conductivity for each of the x, y and z directions and thus indicate the orientation of the anisotropic graphite; the higher numbers correspond to the directions of relatively high thermal conductivity.

Referring now to FIGS. 4 through 9 various embodiments of the invention are shown in the context of heat sinks rather than heat spreaders.

Figure 4:
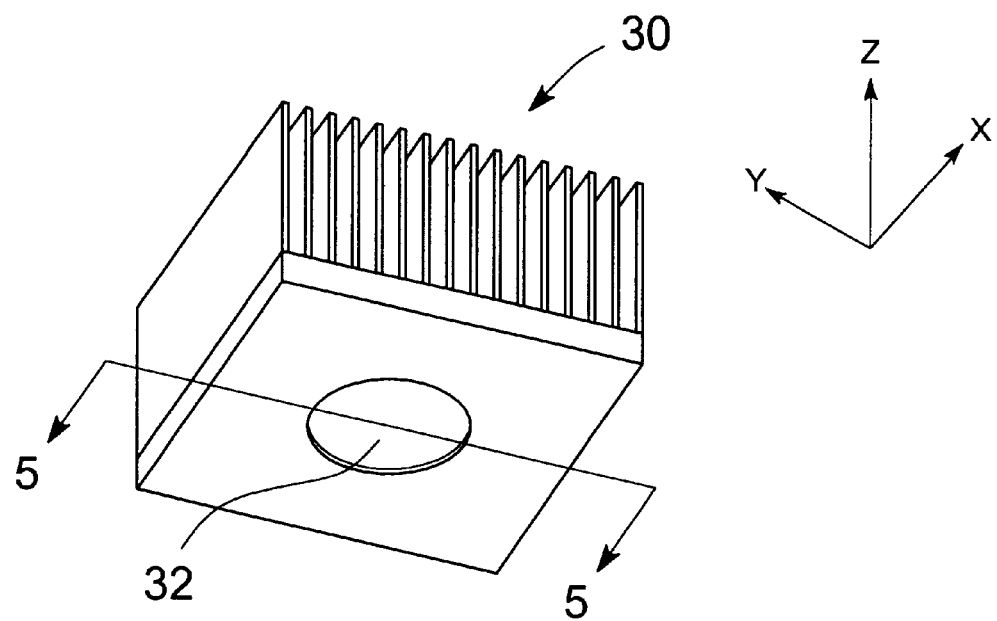
FIG. 4 is a perspective view of a heat dissipating component in the form of a heat sink having a cylindrical insert.
Figure 5:
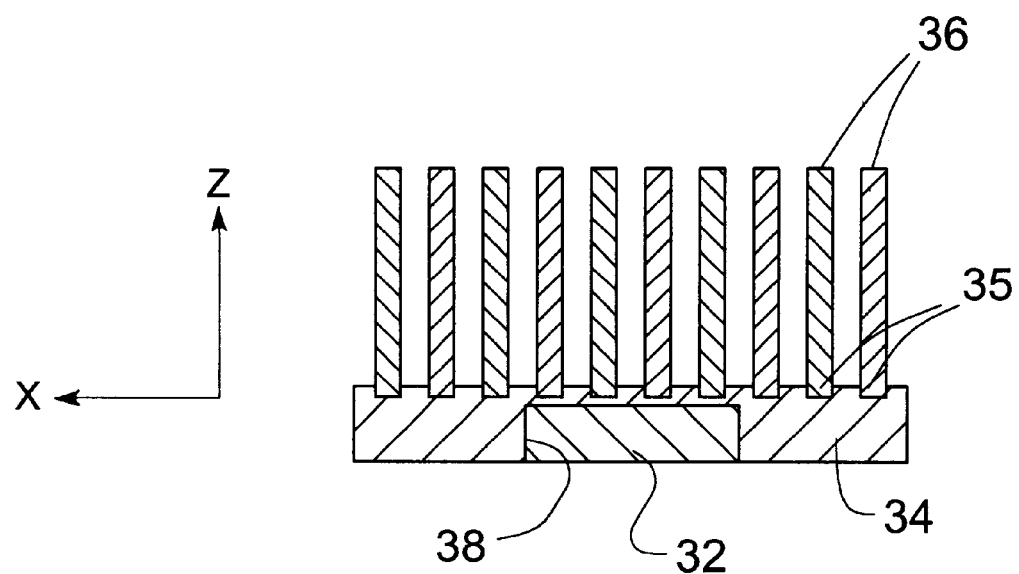
FIG. 5 is a section view taken along line 5—5 of FIG. 4.

In FIG. 4 a perspective view is thereshown of a finned heat sink 30 having a cylindrical insert 32. FIG. 5 shows a cross-section view along line 5—5 of FIG. 4 for a finned heat sink 30 having a planar graphite base plate 34 with a plurality of graphite fins 36. The anisotropic graphite material of base plate 34 has its high conductivity directions aligned with the x and y axes. The fins 36 are preferably separate elements with their high conductivity directions including the z direction. Fins 36 are received in grooves 35 machined in base plate 34 and are held in place therein by an epoxy resin or other suitable bonding material. Base plate 34 has a cavity 38 extending partially therethrough in the z direction. Core 32 is received in cavity 34.

The following Table II shows performance data for the design of FIGS. 4 and 5 utilizing different materials. This data was generated by numerical modeling. Design option #1 is for a pure copper heat sink without any insert. Design #2 is for a pure aluminum heat sink without any insert. Design option #3 is for a pure graphite heat sink without any insert. The graphite orientation of design option #3 has the high conductivity of the base plate parallel to the plane of the fins. Design #4 is representative of the present invention wherein the heat sink is constructed of graphite with a copper insert 32, as illustrated in FIG. 5. The graphite orientation of the base plate in design option #4 has the high conductivity in the x and y directions. As seen in Table II, the performance of the present invention utilizing a graphite heat sink with a copper insert is almost as good as that of a pure copper heat sink and is far superior to either a pure aluminum or pure graphite heat sink.

TABLE II

| # | Design Option | $T_{max}$ (° C.) | $R_{sa}$ (°C./W) | Thermal Conductivity and Graphite Orientation (W/m · ° C.) | | |
|---|---|---|---|---|---|---|
| | | | | X | Y | Z |
| 1 | Copper | 71.7 | 0.61 | 391 | | |
| 2 | Aluminum | 82.1 | 0.79 | 209 | | |
| 3 | Pure-Graphite | 91.5 | 0.94 | 400 | 7 | 400 |
| 4 | Graphite with Copper Insert | 73.7 | 0.65 | 400 | 400 | 7 |

Figure 6:
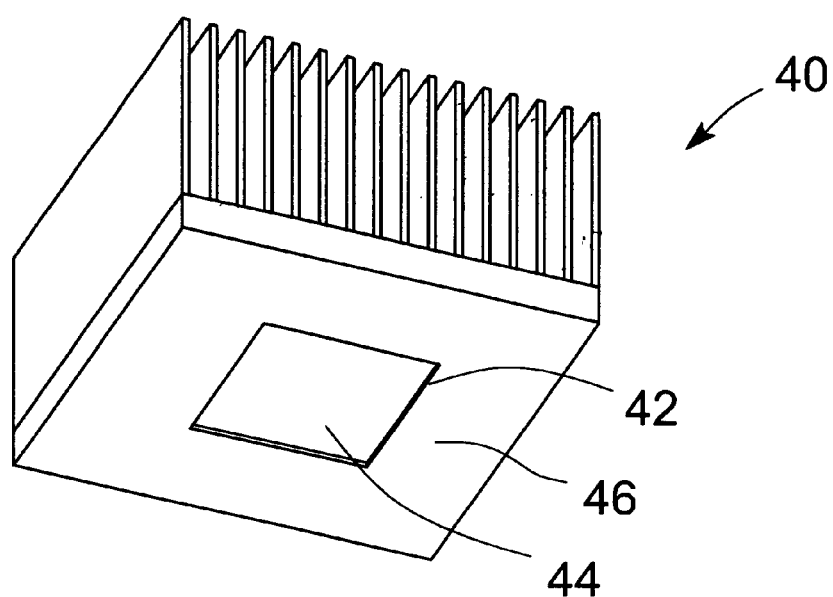
FIG. 6 is a view similar to FIG. 4 of a heat sink having a square insert.

Referring now to FIG. 6, an embodiment similar to that of FIG. 4 is shown and designated by the numeral 40. The heat sink 40 differs in that it has a rectangular insert 42 received within a rectangular cavity 44 in the base plate 46.

Figure 7:
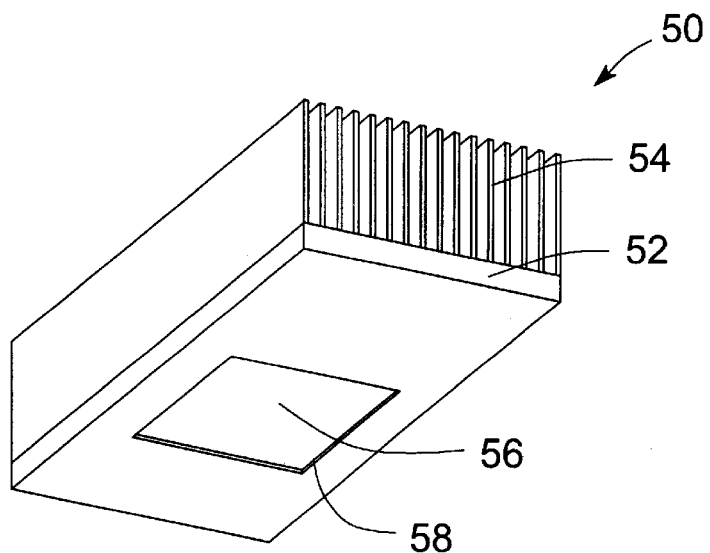
FIG. 7 is a perspective view of a larger scale rectangular heat sink having a rectangular or square insert.

FIG. 7 shows still a further alternative embodiment of a heat sink designated by the numeral 50. The heat sink in FIG. 7 is one designed for large size electronic chips. The heat sink 50 has a base plate 52 with fins 54. A square insert 56 is received within a square cavity 58 defined through the base plate 52.

The data shown in the following Table III compares the performance of a heat sink constructed in accordance with FIG. 7 with a prior art aluminum heat sink having a copper base (design #1). The design option #1 is like that being currently sold by Radian Company, 2160 Walsh Avenue, Santa Clara, Calif. 95050; it is an aluminum heat sink with a partially hollowed out base filled with a copper plug. Design option #2 is in accordance with the present invention having a graphite heat sink 50 with graphite base plate 52 and graphite fins 54 and a copper insert 56. As shown by Table III, the performance of the graphite heat sink with copper insert of the present invention is far superior to that of the aluminum and copper heat sink of design option #1.

TABLE III

| # | Design Option | $T_{max}$ (° C.) | $R_{sa}$ (° C./W) | Weight (kg) |
|---|---|---|---|---|
| 1 | Aluminum (with Copper Base) | 64.27 | 0.33 (Power = 90 W) | 3.292 |
| 2 | Graphite (with copper insert) | 55.21 | 0.22 (Power = 90 W) | 1.647 |

Figure 8:
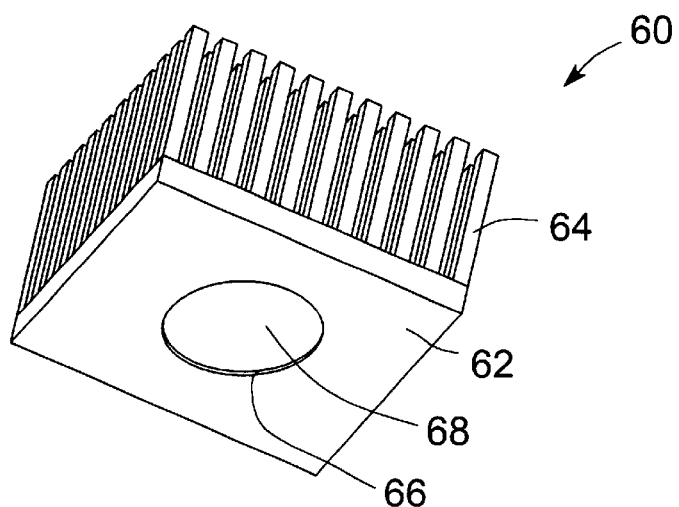
FIG. 8 is a perspective view of a pin-fin heat sink having a cylindrical insert.
Figure 9:
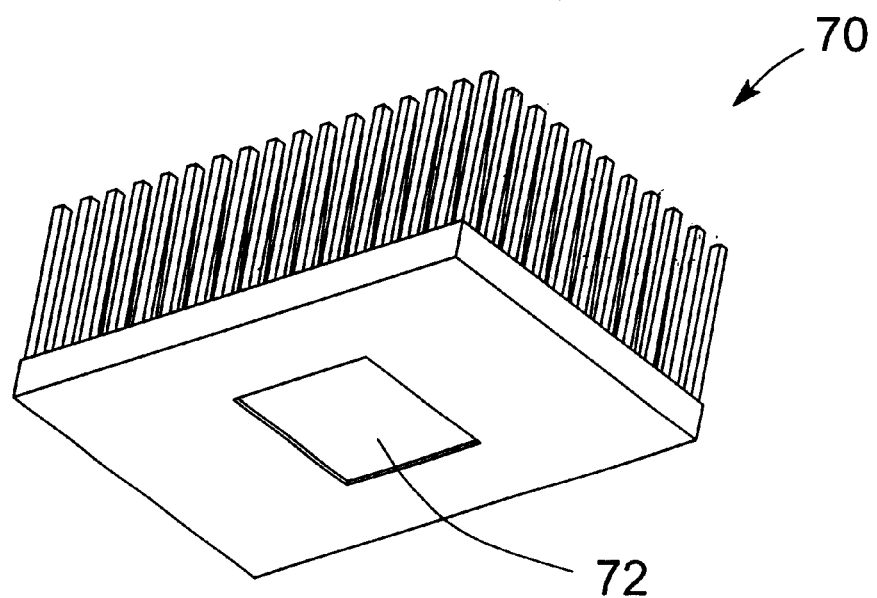
FIG. 9 is a perspective view of a pin-fin heat sink having a square insert.

Finally FIGS. 8 and 9 show perspective views of another type of heat sink known as a "pin-fin" heat sink. FIG. 8 shows a pin-fin heat sink 60 having a base plate 62 and a plurality of pin-fins 64. A cylindrical cavity 66 in the base plate 62 contains a cylindrical insert 68.

FIG. 9 shows a pin-fin heat sink 70 which is similar except that it utilizes a square or rectangular insert 72.

The data of the following Table IV shows the performance of a pin-fin heat sink shaped like that of FIG. 8, with design options #1 and #2 being conventional prior art aluminum or copper heat sinks, and with option #3 showing the performance of the present invention utilizing a graphite heat sink with a copper insert 68.

TABLE IV

| #1 | Design Option | $T_{max}$ (° C.) | $R_{sa}$ (° C./W) |
|---|---|---|---|
| 1 | Aluminum | 82.13 | 1.89 |
| 2 | Copper | 77.08 | 1.683 |
| 3 | Graphite (Copper Insert) | 78.79 | 1.751 |

Methods of Construction

The inserts may be placed in the cavities of the heat dissipating components in several different ways.

One preferred method is to machine the insert to a very slightly larger diameter or dimension than the cavity machined into the graphite. Then the insert is cooled and it will contract to a diameter or dimension less than that of the cavity, allowing the insert to be placed inside the cavity. Upon warming of the insert to room temperature the insert will expand and fit snugly within the cavity with no adhesives or binders. If needed, a thin layer of thermal grease or phase change material or other lubricant can be coated onto the insert or on the inside of the cavity prior to inserting the insert.

Accordingly, a thermal management system has been provided wherein the heat dissipating element provides a thermal conductivity comparable to that of copper but with only one-fifth the weight of copper. This makes for lighter electronic devices, reducing the need for special mechanical fixtures and designs to hold heavy copper components. Reducing the mass of the heat dissipating component reduces acceleration stress on electronics due to vibration, and allows for higher power to be dissipated than would otherwise be possible with conventional aluminum or copper heat sinks. Further design flexibility is provided in that smaller heat sinks may be utilized to obtain the necessary cooling as compared to prior art designs.

Thus it is seen that the apparatus and methods of the present invention readily achieve the ends and advantages mentioned as well as those inherent therein. While certain preferred embodiments of the invention have been illustrated and described for purposes of the present disclosure, numerous changes in the arrangement and construction of parts and steps may be made by those skilled in the art, which changes are encompassed within the scope and spirit of the present invention as defined by the appended claims.

What is claimed is:

1. A thermal management system, comprising:
    an anisotropic graphite planar element comprising compressed particles of exfoliated graphite having a relatively high thermal conductivity in the plane of the planar element and having a relatively low thermal conductivity across a thickness of the planar element in a direction normal to the plane of the planar element, the planar element having a cavity defined therein; and
    a core closely received in the cavity, the core being constructed of an isotropic core material so that heat from a heat source can be conducted via the core into the thickness of the planar element and then out across the plane of the planar element.

2. The system of claim 1, wherein the planar element is shrink fit with the core by thermal expansion and contraction of at least one of the planar element and the core.

3. The system of claim 1, further comprising:

a lubricant layer between the core and the cavity of the planar element, so that the lubricant layer provides a thermal interface between the core and the planar element.

4. The system of claim 1, wherein:

the planar element Comprises a plurality of anisotropic sheets of compressed particles of exfoliated graphite laminated together, the sheets being oriented parallel to the plane of the planar element.

5. The system of claim 4, wherein the sheets are resin impregnated.

6. The system of claim 4, wherein the core extends completely through the laminated sheets.

7. The system of claim 1, wherein the core material is a metal.

8. The system of claim 1, wherein the core material comprises copper.

9. The system of claim 1, wherein the core is a cylindrical shaped core having a cylindrical axis oriented normal to the plane of the planar element.

10. The system of claim 1, further comprising:

a heat source having a heat conducting area defined thereon in contact with the core.

11. The system of claim 10, wherein:

the heat conducting area of the heat source is a top surface of the heat source and the entire top surface of the heat source is covered by and in contact with the core.

12. The system of claim 1, wherein the system is a heat spreader.

13. The system of claim 1, wherein the system is a heat sink.

14. A thermal management system, comprising:

a heat source having a heat transmitting surface;

an anisotropic planar element comprising compressed particles of exfoliated graphite, said element having x and y dimensions defining a generally planar extent of the planar element and having a z dimension defining a thickness of the planar element, the planar element having a relatively high thermal conductivity in the x and y directions and a relatively low thermal conductivity in the z direction, the planar element having a cavity defined therein extending at least partially through the thickness of the planar element; and an insert received in the cavity in heat conducting engagement with the planar element, the insert having a heat receiving surface operatively engaging the heat transmitting surface of the heat source, so that heat from the heat source flow across the heat transmitting surface and the heat receiving surface, into the insert in the z direction and then out through the planar element in the x and y directions.

15. The system of claim 14, wherein:

the heat transmitting surface of the heat source is entirely covered by the heat receiving surface of the insert.

16. The system of claim 14, wherein:

the insert is constructed from an isotropic material.

17. The system of claim 16, wherein the isotropic material of the insert is copper.

18. The system of claim 14, wherein:

the insert is constructed from an anisotropic material.

19. The system of claim 14, wherein:

the cavity and the insert both extend completely through the thickness of the planar element.

20. The system of claim 14, wherein:

the cavity and the insert both extend partially through the thickness of the planar element.

21. The system of claim 14, wherein:

the planar element comprises a plurality of sheets of compressed particles of exfoliated graphite laminated together.

22. The system of claim 21, wherein:

the sheets are resin impregnated.

23. A method of dissipating heat from a heat source, comprising:

(a) providing an anisotropic heat dissipating element comprising compressed particles of exfoliated graphite having relatively high thermal conductivity in x and y directions, and having relatively low thermal conductivity in a z direction perpendicular to the x and y directions, the heat dissipating element having a cavity defined therethrough in the z direction, and having an isotropic heat conducting insert disposed in the cavity;

(b) placing the insert in heat conducting relationship with a heat source;

(c) conducting heat from the heat source through the insert and into the anisotropic heat dissipating element; and (d) conducting heat through the heat dissipating element in the x and y directions.

* * * * *